United States Patent
Lai et al.

(10) Patent No.: US 6,844,626 B2
(45) Date of Patent: Jan. 18, 2005

(54) BOND PAD SCHEME FOR CU PROCESS

(75) Inventors: Chia-Hung Lai, Hsin-Chu (TW); Jiunn-Jyi Lin, Hsin-Chu (TW); Tzong-Sheng Chang, Hsin-Chu (TW); Min Cao, Hsin-Chu (TW); Huan-Chi Tseng, Hsin-Chu (TW); Yu-Hua Lee, Hsin-Chu (TW); Chin-Tien Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/444,229

(22) Filed: May 23, 2003

(65) Prior Publication Data

US 2004/0235223 A1 Nov. 25, 2004

(51) Int. Cl.[7] .......................... H01L 23/48; H01L 23/52; H01L 29/40
(52) U.S. Cl. .......................... 257/737; 257/738; 257/779
(58) Field of Search .................. 257/737, 738, 257/765, 779, 780, 786

(56) References Cited

U.S. PATENT DOCUMENTS 6,187,680 B1 * 2/2001 Costrini et al. ............. 438/688
6,709,965 B1 * 3/2004 Chen et al. ................. 438/612

OTHER PUBLICATIONS

Wolf, Stanley, et al., "Silicon Processing for the VLSI Era, vol. 1: Process Technology," 2nd Edition, 2000, pp. 841–854, Lattice Press, Sunset Beach, CA.

* cited by examiner

*Primary Examiner*—Hoai Pham
(74) *Attorney, Agent, or Firm*—Slater & Matsil, L.L.P.

(57) ABSTRACT

A novel method of forming a bond pad of a semiconductor device and a novel bond pad structure. Two passivation layers are used to form bond pads of a semiconductor device. A portion of the second passivation layer resides between adjacent bond pads, preventing shorting of the bond pads during subsequent wire bonding processes or flip-chip packaging processes.

13 Claims, 3 Drawing Sheets

BOND PAD SCHEME FOR CU PROCESS

TECHNICAL FIELD

The present invention relates generally to the fabrication of semiconductor devices, and more particularly to a method of forming bond pads and a bond pad structure for semiconductor devices.

BACKGROUND

Semiconductor devices are used in many electronic applications, such as radios, televisions, cell phones and computers, as examples. Semiconductor devices are often fabricated as integrated circuits, with hundreds or thousands of devices often being manufactured on a single chip.

After a semiconductor device or integrated circuit has been fabricated, electrical connections must be made to the semiconductor device in order to connect it to other electronic components. This is usually accomplished by, after attaching the device to a package substrate or lead frame, making electrical connection between the bond pads of the device and the inner leads of the package, and the package leads are connected to pins located on the exterior of the package. Wire bonding is a common technique for making connections between the semiconductor device inputs/outputs (I/O's) and the package, especially for integrated circuits having up to about 224 I/O's.

Wire bonding is typically carried out after the integrated circuit is attached to a package. Flexible wires are usually attached one at a time to bond pads on the integrated circuit, and the other end of the flexible wire is attached to a contact on the package. Three types of wire bond methods include thermocompression bonding, ultrasonic bonding, and thermosonic bonding, as examples.

In order facilitate the wire bonding process, typically an integrated circuit 100 will have bond pads 112 formed at a top surface thereof, as shown in the prior art drawing of FIG. 1. In the semiconductor device 100 shown, a workpiece 102 having an insulating layer 104 formed at a top region thereof has a conductive region 106 or a plurality of conductive regions 106 formed within the insulating layer 104. The conductive regions 106 may comprise conductive lines, or may alternatively comprise a pad of conductive material formed in a circular or square shape, as examples. The conductive regions 106 may be electrically coupled to circuits or elements (not shown) that have been formed in the underlying workpiece 102, for example.

To form a bond pad 112, typically a passivation layer 108 is deposited over the insulating layer 104 and exposed portions of the conductive regions 106. The passivation layer 108 typically comprises a first layer comprised of plasma enhanced silicon nitride (PE-SiN) deposited in a thickness of about 0.075 $\mu$m. The passivation layer also includes a second layer of plasma enhanced silicon dioxide (PE-OX) deposited in a thickness of about 0.4 $\mu$m over the first PE-SiN layer. The passivation layer 108 also includes a third layer of PE-SiN deposited in a thickness of about 0.6 $\mu$m over the PE-OX layer.

The passivation layer 108 is patterned to expose a portion of the top surface of the conductive regions 106 using traditional photolithography and a photoresist (not shown), and a bond pad material 112 is deposited over the patterned passivation layer 108. The bond pad material 112 may conform to the underlying topography of the underlying patterned passivation layer 108, as shown. The bond pad material 112 is then patterned, also using traditional photolithography techniques and a photoresist (not shown), to form bond pads 112 that are electrically coupled to the underlying conductive regions 106. Wires may then be bonded to the bond pads 112 to electrically connect the semiconductor device 100 to a package or another semiconductor device or circuit, for example.

There is a trend in the semiconductor industry towards scaling or reducing the size of integrated circuits. As a result, the minimum feature size of integrated circuits is becoming smaller and smaller. This makes the wire bonding process for semiconductor devices more challenging. For example, as shown in FIG. 1, the space "x" between adjacent bond pads 112 may be 3 $\mu$m or less. After a wire 114 is bonded to the bond pads 112, as shown in FIG. 2, shorts 116 may be formed between adjacent bond pads 112 due to the deformation and distortion of the bond pads 112 during the wire bonding process.

Therefore, what is needed in the art is a bond pad scheme that prevents electrical shorts between adjacent bond pads when the semiconductor device is subjected to mechanical stress, such as wire bonding.

SUMMARY OF THE INVENTION

These and other problems are generally solved or circumvented, and technical advantages are generally achieved, by preferred embodiments of the present invention, which provide a novel bond pad scheme wherein two passivation layers are used in the formation of the bond pads. Portions of the top passivation layer are disposed between adjacent bond pads so that shorts are prevented from forming between adjacent bond pads during the wire bonding process.

In accordance with a preferred embodiment of the present invention, a method of forming a bond pad of a semiconductor device includes providing a workpiece, the workpiece having at least one conductive region at the top surface thereof, forming a first passivation layer over the workpiece and at least one conductive region, and forming a second passivation layer over the first passivation layer. The second passivation layer is patterned to form an opening in the second passivation layer over the at least one conductive region, and the first passivation layer is patterned to form an opening in the first passivation layer over the at least one conductive region. The first passivation layer opening has a first width and the second passivation layer has a second width, wherein the second width is greater than the first width. A bond pad material is deposited over the exposed at least one conductive region, the first passivation layer and the second passivation layer, and the bond pad material is patterned to form a bond pad over the at least one conductive region.

In accordance with another preferred embodiment of the present invention, a semiconductor device includes a workpiece, at least one conductive region formed in a top surface of the workpiece, a first passivation layer disposed over the at least one conductive region and over the workpiece top surface, and a second passivation layer disposed over the first passivation layer. The semiconductor device includes a bond pad disposed over and abutting the at least one conductive region, wherein the bond pad comprises a greater width within the second passivation layer than in the first passivation layer, and wherein a portion of the second passivation layer resides between adjacent bond pads.

Embodiments of the present invention achieve technical advantages by providing a scheme for fabricating bond pads of a semiconductor device that prevents shorts between adjacent bond pads during the wire bonding process. By the use of a second passivation layer, the bond pads are formed such that the bond pad material does not reside on the top surface of the second passivation layer. A portion of the second passivation layer resides between each bond pad, preventing shorts from occurring, even in semiconductor devices having very small dimensions.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
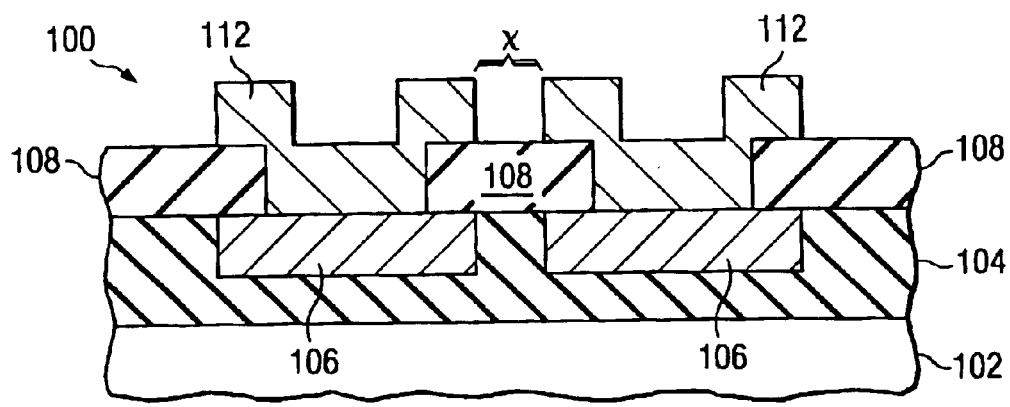
FIGS. 1 and 2 show cross-sectional views of a prior art bond pad scheme.
Figure 2:
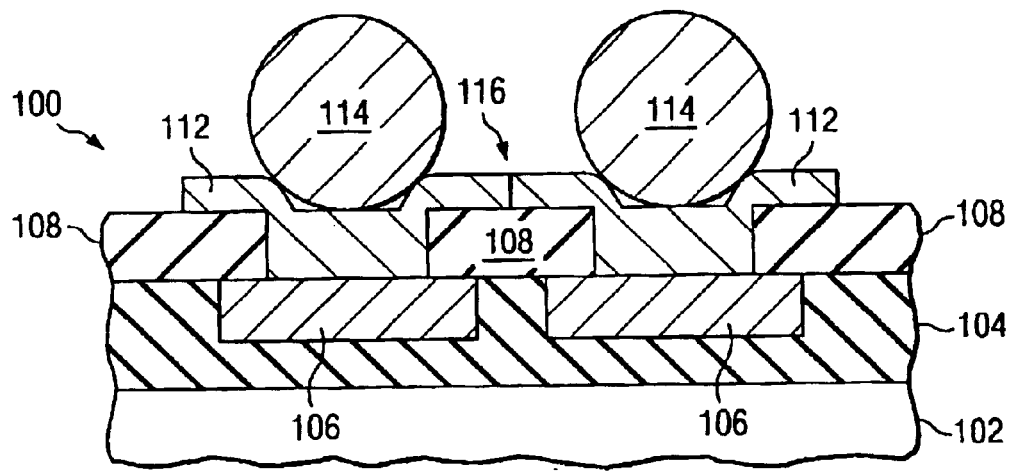

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Only two bond pads are shown in each figure; however, there may be many other bond pads formed in the layer of the semiconductor devices shown in the drawings. While embodiments are described herein for use with manufacturing bond pads that make electrical contact to copper-containing conductive regions, the novel bond pad scheme described herein is also beneficial for semiconductor devices having contact regions comprised of other conductors, for example.

Figure 3:
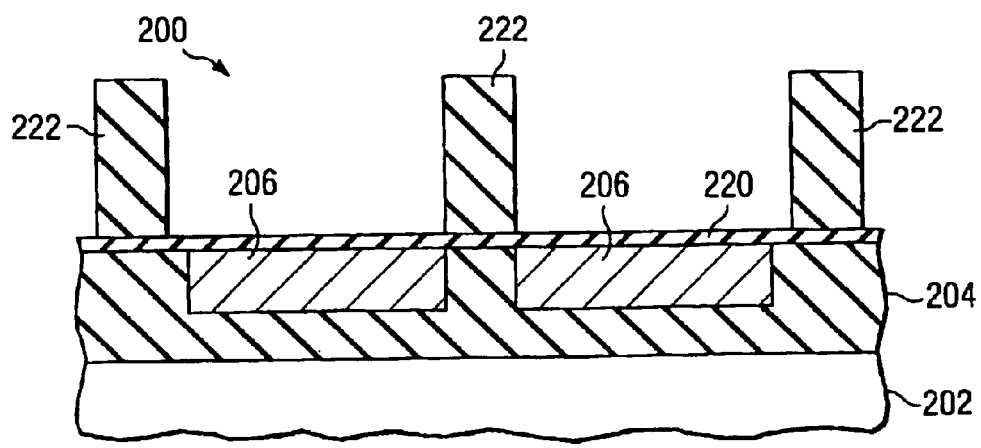
FIGS. 3–6 show cross-sectional views of an embodiment of the present bond pad invention at various stages of manufacturing.

With reference now to FIG. 3, a method of forming a bond pad of the semiconductor device 200 in accordance with an embodiment of the present invention will next be described. First, a workpiece 202 is provided. The workpiece 202 typically comprises silicon oxide over a single crystal silicon wafer. The workpiece 202 may include other conductive layers or other semiconductor elements, e.g., transistors, diodes, etc. (not shown). Compound semiconductors such as GaAs, InP, Si/Ge, SiC, for example, may be used in place of silicon.

An insulating layer 204 is deposited over the workpiece 202. The insulating layer 204 may comprise an interlevel dielectric such as silicon dioxide, as an example. Alternatively, the insulating layer 204 may comprise low-k dielectric materials or high-k dielectric materials, for example.

Conductive regions 206 are formed within the insulating layer 204, as shown. The conductive regions 206 preferably comprise copper, and may alternatively comprise aluminum, copper alloys, or other metals, as examples. The conductive regions 206 may include a liner disposed over the insulating layer 204, for example, (not shown). The conductive regions 206 may comprise conductive lines, or alternatively they may comprise a pad shape, such as a circular, elliptical square or rectangular pad, as examples. The conductive regions 206 may alternatively comprise other shapes. The conductive regions 206 may be coupled to circuits and/or elements that reside in the underlying workpiece 202. These circuits and elements may comprise memory devices, logic circuits, or elements such as capacitors, resistors, or diodes, as examples.

The conductive regions 206 may be formed in a subtractive process, e.g., a conductive material may be deposited, and the conductive material is patterned using photolithography to remove portions of the conductive material and form the conductive regions 206. Insulating layer 204 is then deposited between the conductive regions 206. Alternatively, particularly if the conductive regions 206 comprise copper, the conductive regions 206 may be formed in a damascene process, e.g., the insulating layer 204 is patterned using photolithography, and a conductive material is deposited over the patterned insulating layer 204. Excess conductive material is removed by planarizing the insulating layer 204, e.g., using a chemical-mechanical polish (CMP) process.

Next, in accordance with an embodiment of the invention, a first passivation layer 220 is deposited over the exposed top portion of the conductive region 206 and the insulating layer 204. The first passivation layer 220 is preferably relatively thin. For example, the first passivation layer 220 is preferably 0.3 µm or less. Alternatively, the first passivation layer 220 may comprise a thickness ranging from 0.1 to 0.8 µm, for example.

In one embodiment, the first passivation layer 220 comprises three layers. The first passivation layer 220 includes a first silicon nitride layer deposited over the insulating layer 204 and conductive regions 206 in a thickness of approximately 0.075 µm. The first passivation layer 220 also includes a layer of PE-OX deposited in a thickness of approximately 0.25 µm over the first silicon nitride layer. The first passivation layer 220 also includes a second silicon nitride layer deposited in a thickness of approximately 0.075 µm over the PE-OX layer. Alternatively, the first passivation layer may comprise a single layer, a bi-layer and may comprise other insulating materials, for example.

A second passivation layer 222 is deposited over the first passivation layer 220, as shown in FIG. 3. Preferably, the second passivation layer comprises a thickness that is greater than the thickness of the first passivation layer. For example, the second passivation layer 222 is preferably approximately at least 2 times greater than the thickness of the first passivation layer 220, and more preferably is approximately 3 to 6 times greater than the thickness of the first passivation layer.

The second passivation layer 222 preferably comprises two or more layers, and in one embodiment, the second passivation layer 222 preferably comprises an oxide layer such as PE-OX deposited in a thickness of 0.4 µm, and a silicon nitride layer deposited over the oxide layer in a thickness of 0.6 µm, for example. Alternatively, the second passivation layer 222 may comprise a single layer, a tri-layer, and may comprise other insulating materials, for example.

The second passivation layer 222 is patterned to remove the second passivation layer 222 material from over the conductive regions 206, as shown in FIG. 3. The second passivation layer 222 may be patterned, for example, by depositing a photoresist (not shown) over the second passivation layer 222, patterning the photoresist, and then using the photoresist to pattern the underlying second passivation layer 222. The photoresist is then stripped or removed, leaving the structure shown in FIG. 3. Alternatively, other lithography techniques may be used to pattern the second passivation layer 222.

Figure 4:
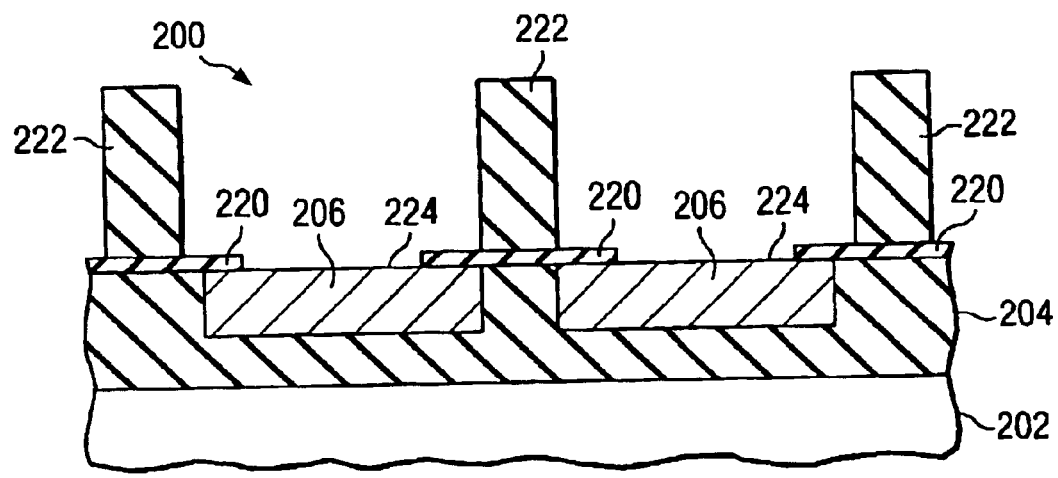

Referring now to FIG. 4, the first passivation layer 220 is then patterned. The first passivation layer 220 may be patterned, for example, by depositing a photoresist (not shown) over the patterned second passivation layer 222 and exposed portions of the first passivation layer 220. The photoresist is then patterned, and the photoresist is used as a mask, while the first passivation layer 220 is etched. The photoresist is then removed, leaving the structure as shown in FIG. 4. Alternatively, other lithography techniques may be used to pattern the first passivation layer 220.

In accordance with embodiments of the present invention, preferably, the opening in the second passivation layer 222 has a greater width than the width of the opening formed in the first passivation layer 220. The second passivation layer 222 opening may be 0.4 µm wider than the first passivation layer 220 opening, although the difference in the first and second passivation layer opening widths may alternatively range from about 0.1 to 0.8 µm, as examples. Note that the top surface 224 of the conductive regions 206 is exposed after the first passivation layer 220 is patterned.

Figure 5:
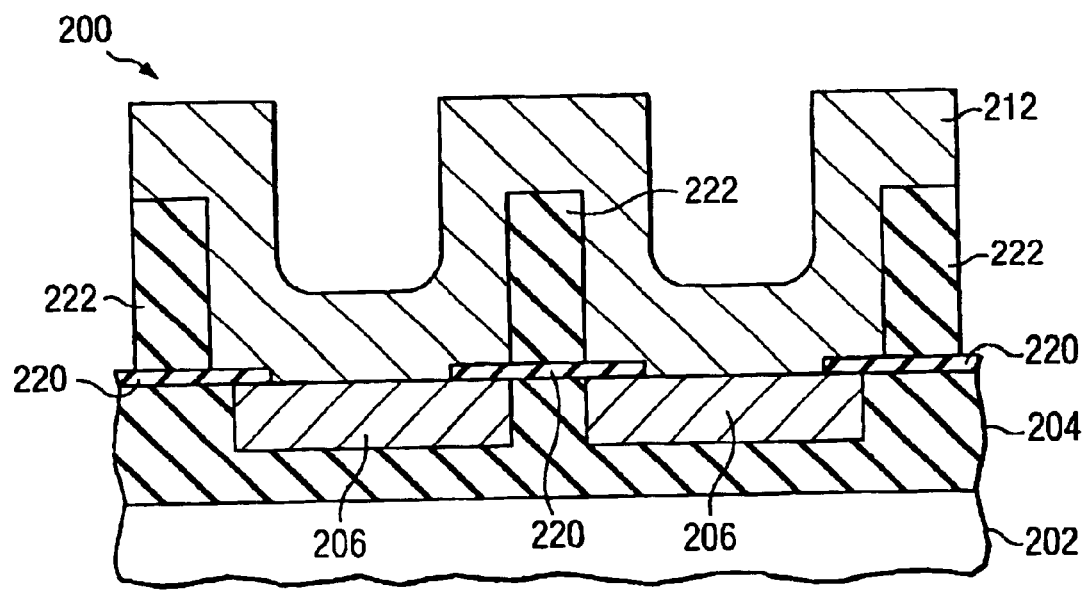

A bond pad material 212 is then deposited over the exposed conductive regions 206, and the first and second passivation layers 220 and 222, as shown in FIG. 5. The bond pad material 212 abuts the top surface of the conductive regions 206 and makes electrical contact therewith. The bond pad material 212 may comprise an alloy such as aluminum-copper, for example, although alternatively, the bond pad material 212 may comprise other conductive materials, for example. In one embodiment, the bond pad material preferably comprises an alloy containing 95 to 99.5% aluminum and 0.5 to 5% copper. The bond pad material 212 may be deposited in a thickness of approximately 1.0 to 1.5 µm, for example, although the bond pad material 212 may comprise other thicknesses. Preferably, the thickness of the bond pad material 212 is less than the thickness of the second passivation layer 222, for example. The bond pad material 212 may be deposited by sputtering, for example.

Figure 6:
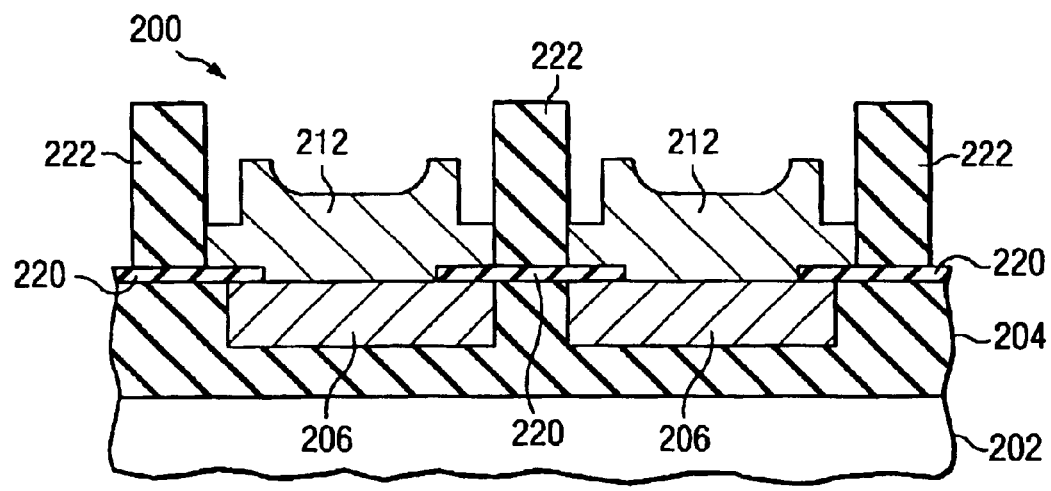

As shown in FIG. 6, the bond pad material 212 is patterned, also using photolithography, for example, to form bond pads 212 that are electrically coupled to the underlying conductive regions 206. Note that because a portion of the second passivation layer 222 is disposed between adjacent bond pads 212, shorting of the bond pads 212 is prevented during subsequent wire bonding processes or flip-chip packaging processes, as examples.

Figure 7:
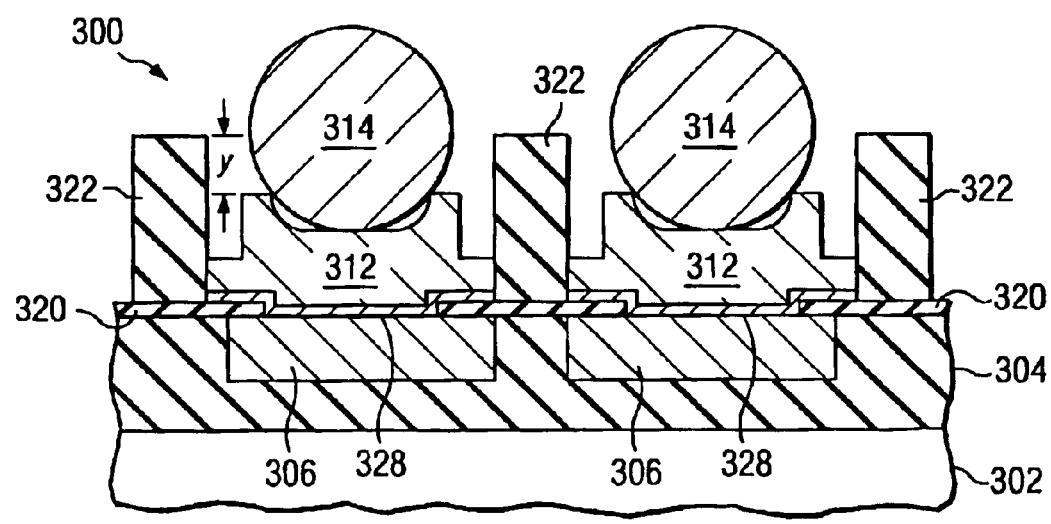
FIG. 7 shows another embodiment of a bond pad scheme of the present invention.

An alternative embodiment 300 of the present invention is shown in FIG. 7. In FIG. 7, a wire 314 is shown bonded to the underlying bond pads 312. Again, because a portion of the second passivation layer 322 resides between adjacent bond pads 312, shorting of adjacent bond pads 312 is prevented, in accordance with embodiments of the present invention. Note also that there exists a height differential "y" between the height of the second passivation layer 322 and the top surface of the bond pads 312.

Also note that in this embodiment, a stop layer 328 is disposed between the conductive regions 306 and the bond pads 312. The stop layer 328 may comprise TaN deposited in a thickness of about 0.06 µm, as an example, although alternatively, the stop layer 328 may comprise other thicknesses and materials. The stop layer 328 may be deposited over the conductive regions 306 prior to the deposition of the bond pad material 312, for example.

Advantages of embodiments of the invention include providing a scheme for forming bond pads of semiconductor device that prevents shorts in adjacent bond pads. The bond pad scheme is advantageous during subsequent wire bonding processes or flip-chip packaging processes, and also prevents pad bridging when the semiconductor device is subjected to electrical tests, when probes may be used to contact the bond pads 212 and 312.

Although embodiments of the present invention and their advantages have been described in detail, it should be understood that various changes, substitutions and alterations can be made herein without departing from the spirit and scope of the invention as defined by the appended claims. For example, many of the features, functions, materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a workpiece;
   at least one conductive region formed in a top surface of the workpiece;
   a first passivation layer disposed over the at least one conductive region and over the workpiece top surface;
   a second passivation layer disposed over the first passivation layer; and
   a bond pad disposed over and abutting the at least one conductive region, wherein the bond pad comprises a greater width within the second passivation layer than in the first passivation layer, wherein a portion of the second passivation layer resides between adjacent bond pads, and wherein the portion of the second passivation layer residing between the adjacent bond pads has a height greater than a distance between the adjacent bond pads.

2. The semiconductor device according to claim 1, wherein the at least one conductive region comprises copper, and wherein the bond pad material comprises aluminum-copper.

3. The semiconductor device according to claim 1, wherein the bond pad material comprises about 1.0 to 1.5 μm of an alloy containing 95 to 99.5% aluminum and 0.5 to 5% copper.

4. The semiconductor device according to claim 3, further comprising a stop layer disposed over the at least one conductive region.

5. The semiconductor device according to claim 4, wherein the stop layer comprises TaN.

6. The semiconductor device according to claim 1, wherein the first passivation layer comprises a first layer of silicon nitride, a layer of silicon dioxide disposed over the first silicon nitride layer, and a second layer of silicon nitride disposed over the silicon dioxide.

7. The semiconductor device according to claim 6, wherein the first and second layers of silicon nitride comprise approximately 0.075 μm of silicon nitride, and wherein the layer of silicon dioxide comprises approximately 0.25 μm of silicon dioxide.

8. The semiconductor device according to claim 1, wherein the second passivation layer comprises a layer of silicon dioxide and a layer of silicon nitride.

9. The semiconductor device according to claim 8, wherein the layer of silicon dioxide comprises approximately 0.4 μm of silicon dioxide, and wherein the layer of silicon nitride comprises approximately 0.6 μm of silicon nitride.

10. The semiconductor device according to claim 1, wherein the bond pad material comprises a thickness less than thickness of the second passivation layer.

11. The semiconductor device according to claim 1, wherein the thickness of the second passivation layer is greater than the thickness of the first passivation layer.

12. The semiconductor device according to claim 1, wherein the portion of second passivation layer residing between adjacent bond pads prevents shorting of the adjacent bond pads.

13. The semiconductor device according to claim 1, wherein the bond pad has a top surface located below a top surface of the second passivation layer.

* * * * *